United States Patent
Kamo et al.

[11] Patent Number: 5,625,332
[45] Date of Patent: Apr. 29, 1997

[54] OXIDE SUPERCONDUCTING WIRE AND SUPERCONDUCTING APPARATUS THEREOF

[75] Inventors: Tomoichi Kamo, Toukai-mura; Keiji Fukushima, Hitachi; Seizi Takeuchi, Hitachioota, all of Japan

[73] Assignee: Hitachi, Ltd., Tokyo, Japan

[21] Appl. No.: 240,314

[22] Filed: May 10, 1994

[30] Foreign Application Priority Data

May 17, 1993 [JP] Japan .................................. 5-114366

[51] Int. Cl.⁶ .................................................. H01F 1/00
[52] U.S. Cl. ........................ 335/216; 505/230; 174/125.1
[58] Field of Search ...................... 335/216; 174/125.1; 505/230, 231, 704, 705, 211, 884, 887

[56] References Cited

U.S. PATENT DOCUMENTS

| | | |
|---|---|---|
| 4,929,596 | 5/1990 | Meyer et al. ........................... 505/1 |
| 5,384,307 | 1/1995 | Lay ........................................ 505/430 |

FOREIGN PATENT DOCUMENTS

| | | |
|---|---|---|
| 0358779 | 3/1990 | European Pat. Off. . |
| 3731266 | 4/1989 | Germany . |

OTHER PUBLICATIONS

Patent Abstracts of Japan, vol. 015, No. 403 (C–0875), 15 Oct. 1991 & JP A–03 166 348 (Keiichiro Yoshida) 18 Jul. 1991 *Abstract*.

*Primary Examiner*—Lincoln Donovan
*Attorney, Agent, or Firm*—Antonelli, Terry, Stout & Kraus, LLP

[57] ABSTRACT

A superconducting wire comprising a conductor core composed of an oxide superconducting material and a sheath material composed of conductive metal formed at periphery of the conductor core, characterized in that the sheath material is a composite metal including dispersed non-superconductive metallic oxide therein. In accordance with the present invention, oxide superconducting wire having a large mechanical strength, and controllable electric conductivity and thermal conductivity at an arbitrary range corresponding to its using object can be provided.

11 Claims, 2 Drawing Sheets

OXIDE SUPERCONDUCTING WIRE AND SUPERCONDUCTING APPARATUS THEREOF

BACKGROUND OF THE INVENTION

1. Field of the Invention

The present invention relates to superconducting wire using oxide superconductors, especially, relates to superconducting coils, superconducting current leads, and superconducting cables having preferable degree of uniformity in magnetic field and stability, and superconducting apparatus using same.

2. Description of the Prior Art

Oxide superconductors have been extensively investigated since the discovery of $Y_1Ba_2Cu_3O_{7-\delta}$ (M. K. Wu, J. R. Ashburn, C. T. Torng, Y. Q. Wand and C. W. Chu: Phys. Rev. Letter, 58 (1987) 908) having a critical temperature higher than a liquid nitrogen temperature with the discovery of $(La/Ba)_2Cu_1O_{4-\delta}$ as a starting point, because realization of superconductor applied apparatus operable at the liquid nitrogen temperature can be expected.

Especially, development of materials having higher critical temperature than previous one is remarkable, and it has been found that $Bi_2Sr_2Ca_1Cu_2O_{8-\delta} \cdot Bi_2Sr_2Ca_2Cu_3O_{10-\delta}$ are superconductors having a critical temperature of about 80K and about 105K, respectively, (H. Maeda, Y. Tanaka, M. Fukutomi, and T. Asano: Jpn. J. Appl. Phys., 27, (1988) L209), $Tl_2Ba_2Ca_1Cu_2O_{8-67} \cdot _{Tl2}Ba_2Ca_2Cu_3O_{10-\delta}$ are superconductors having a critical temperature of about 110K and about 125K, respectively, (Z. Z. Sheng and A. M. Hermann: Nature 332 (1988) 55), and $Tl_1Sr_2Ca_1Cu_2O_{7-\delta} \cdot _{Tl1}Sr_2Ca_2Cu_3O_{9-\delta}$ are superconductors having a critical temperature of about 75K and about 100K, respectively, (S. Matsuda, S. Takeuchi, A. Soeta, T. Suzuki, T. Kamo: Jpn. J. Appl. Phys., 27 (1988) 2062). Each of all the above superconductors has a superconducting phase having a critical temperature higher than a liquid nitrogen temperature, and since then, material development for improving characteristics of the materials have been continued in order to obtain materials having a high critical temperature, high chemical stability, and a single phase obtainable easily by synthesizing derivatives of which a part of composition is replaced with various elements.

As for application technology operating at the liquid nitrogen temperature for utilizing most effectively feature of the above described high temperature superconducting materials, a conductor such as cables and coils used in a condition of electric resistance zero by making the materials a wire, and usages for thin film superconducting devices have been proposed. Especially, for application to energy related fields, development of oxide superconducting wire is an important technical point. Regarding to technology for manufacturing wires from the oxide superconducting materials, there are many methods are proposed such as a wire draw-rolling method wherein metal such as silver is used as sheath material, a jelly-rolling method wherein oxide superconducting material is applied or laminated on a silver plate, scrolled in a concentric manner, and then the roll is drawn, and a method wherein oxide superconducting material is applied on a silver tape, and so on. In the above examples, gold, silver, or their alloy materials are used as the sheath material or base plate material in view of electrochemical equilibrium because the oxide superconducting material becomes partly a molten condition in a heat treatment process, shows characteristics of a caustic molten salt, and corrodes ordinary metallic conductor material such as copper-iron group.

When manufacturing coils from wire obtained by the above described method, there are some technical problems. When superconducting wire is wound in a coil shape, it is necessary to apply a predetermined tension to the wire in order to maintain stability of the coil. Further, wound wire is effected strongly by electromagnetic force as a hoop stress which is caused by magnetic field and current generated by operation of the wound wire as a magnet. Therefore, a specified tensile strength is required. However, gold and silver which are used as materials for sheaths and base plates at present are materials having a low rigidity, and accordingly, the materials do not satisfy the above strength required for winding or operation.

Further, when a composite oxide superconductor using the sheath material and the base plate is used for permanent switches, current leads, and cables of a superconducting coil or an apparatus thereof using metallic group superconductor and liquid helium as a coolant, there are some cases wherein thermal conductivities of the sheath material and the base plate material must be decreased, or electric resistances of them must be increased. In the above described cases, if the sheath material and the base plate material are gold or silver, the materials are disadvantageous in practical use.

When thinking about an application of the above described oxide superconductors to a coil, a permanent switch, a current lead, a cable, and others by manufacturing wires, gold or silver is selected as materials for sheaths and base plates in view of a chemical equilibrium. However, gold and silver do not satisfy requirements for a practical material of wire in characteristics such as a preferable mechanical strength of the conductor, a low thermal conductivity, and a wide design selection range in electric resistance under a normal conducting state. That is, in order to realize a compact superconducting coil having an uniform magnetic field and a preferable stability, such wire is required as the one which has a characteristics as of a stabilized material with sufficiently low electric resistance as for sheath material or base plate material, and a sufficient rigidity for enduring electromagnetic force at winding the wire for forming a coil or at operation. Further, in order to realize a mechanically strong current lead having a small heat absorbing property, such sheath material or base plate material is required as the one which has a small thermal conductivity and a preferable mechanical strength. Furthermore, in order to realize a permanent current switch made of superconductor, sheath material or base plate material having a preferable high electric resistance is required.

SUMMARY OF THE INVENTION

(1) Objects of the Invention

The present invention relates to superconducting wire using oxide superconductors, and objects of the present invention are to provide sheath material and base plate material having a large mechanical strength, a low thermal conductivity, and a wide design selection range in electric resistance under a normal conducting state, composite superconducting wire therewith, and superconducting coils, superconducting current leads, permanent current switches, and superconducting cables all of which have an uniform magnetic field and a preferable stability respectively, and superconducting apparatus using thereof.

(2) Methods of Solving the Problems

In order to achieve the above described objects, the inventors investigated the problems diligently and came to realize the present invention described hereinafter.

With a composite oxide superconducting wire being composed of at least a structure having a conductor core made of an oxide superconducting material of which circumferential surface was coated with any of gold, silver or silver alloys, it was found that a superconducting wire having a large mechanical strength, a low thermal conductivity, and a wide design selection range in electric resistance under a normal conducting state can be obtained by composing any of the gold, the silver, or the silver alloys for coating the circumferential surface of the conductor core in a manner wherein oxides are dispersed in the gold, the silver, or the silver alloys.

Detailed executing means of the present invention is described hereinafter.

Many methods for preparing oxide superconducting wire have been proposed. However, in this specification, a wire drawing manufacturing method using a metallic sheath is taken as an example. First, an oxide superconductor or its precursor is pulverized, and filled into a metallic pipe. Subsequently, the metallic pipe is drawn to a wire having a designated diameter by a drawing bench or a swaging machine. The above drawing process has both functions to form a designated shape of the wire and to increase a density of the pulverized oxide superconductor filled in a sheath. In a case when oxide superconductor is used, adding further a process for pressing the drawn wire by a roller such as a roll-press in order to enlarge current paths is effective in obtaining wire having a high critical current density. Aimed wire can be obtained by composing a composite with at least one of the above described wire, winding the composite in a coil shape, or fabricating in a lead shape or a cable shape depending on its using object, and subsequently adding a heat treatment for crystallizing or sintering. A method for forming a wire is not restricted to the above described method, but other methods such as, for example, a method for forming a tape shape wire by pressure welding of green sheets prepared on a metallic base plate by a spray-pyrolysis, a laser deposition method, a plasma spraying method, or a doctor blade method is effective. Even in this case, adding a pressing operation in the manufacturing process of wire in order to increase a critical current density of wire is preferable.

The sheath materials and the base plate materials used in the above described essential manufacturing process are most important subject matters of the present invention. Feature of the present invention is in a structure wherein oxide materials are dispersed in any of gold, silver, or their alloys. As for dispersing oxide materials, there is no special restriction if the oxide material is inactive with oxide superconductor in a heating process of the wire. For instance, aluminum oxides, zirconium oxides, magnesium oxides, yttrium oxides, titanium oxides, and composite oxides of these compounds are preferable materials. Further, a method dispersing oxide particles having a high melting point exceeding a heat treatment temperature of the oxide superconducting wire among composing elements of the oxide superconductor is also effective even if the oxide particles do not react chemically with the oxide superconductor. As for the materials of the dispersing oxide particles, calcia, strontia, baria, and oxides of rare earth elements are preferable. There are a several methods for adding the oxide particles. The first method is a so-called mechanically alloying method wherein pulverized particles of metallic material such as gold or silver and pulverized particles of the above described oxide material are strongly mixed mechanically by a mixer such as a ball mill. In the present invention, as gold and silver are not oxidized at a high temperature, a so-called internal oxidation method wherein metallic elements of the oxide in metallic state are added to the gold or the silver as a precursor of the dispersed oxide, mixed mechanically, and then oxidized to form dispersed oxide, is also effective.

The metallic powder including the dispersed oxide obtained by the above described method is manufactured into a pipe or a plate by cold work or hot work, and are used as a sheath material or a base plate material. Additive amount of the dispersed oxide varies depends on a kind of the dispersed oxide, but, a characteristics such as hardness and strength of the material is mainly determined by particle sizes and an average distance between the dispersed particles of the dispersed oxide material. The average diameter of the dispersed particles is preferably utmost 1000 nm. For example, when an additive amount of the oxide is taken as 1–0.1% by weight and diameters of the dispersed oxide particles are taken as 100–20 nm, the average distance between the dispersed particles is in a range of 1000–100 nm, and aimed characteristics such as hardness and strength of the object material can be obtained. For instance, when a material having a small electric resistance, a small thermal conductivity, and a strong mechanical strength is desired, a condition which makes it possible to obtain a desired electric resistance and a thermal conductivity can be determined by using the additive amount of the oxide as a parameter rather than dispersing the oxide having a smaller diameter than previous one. On the contrary, when a material is required as a preferably effective conductor having a strong mechanical strength without decreasing an electric resistance and a thermal conductivity remarkably, the requirement can be satisfied by making diameter of the additive oxide particles smaller than previous one and dispersing the particles homogeneously. When a sheath material is selected in a manner described above, the sheath material has relatively small electric resistance, and accordingly, achieving a role as a stabilizer for a conventional superconducting coil can be expected.

As for superconducting materials composing superconducting wire, there is no special restriction if the superconducting materials have a critical temperature higher than critical temperatures of conventional metallic or intermetallic compound superconducting wire. Especially, as for representative oxide superconducting materials having critical temperatures higher than a liquid nitrogen temperature, the following materials and their derivatives are effective;

$Y_1Ba_2Cu_3O_{7-\delta}$, $Bi_2Sr_2Ca_1Cu_2O_{8-\delta}$, $Bi_2Sr_2Ca_2Cu_3O_{10-\delta}$, $Tl_2Ba_2Ca_1Cu_2O_{8-\delta}$, $Tl_2Ba_2Ca_2Cu_3O_{10-\delta}$, $Tl_2Sr_2Ca_1Cu_2O_{8-\delta}$, $TlSr_2Ca_2Cu_3O_{9-\delta}$ Especially, it is important to select the above described materials properly depending on environment wherein the oxide superconducting wire relating to the present invention are used. For instance, in a case when an applied magnetic field exceeds a several T (tesla) at a low temperature region below 20K and the magnetic field restricts performance of the superconducting wire, $Bi_2Sr_2Ca_1Cu_2O_{8-\delta}$, $Bi_2Sr_2Ca_2Cu_3O_{10-\delta}$, and their derivatives, or their mixtures are preferable for use. And, in another case when an applied magnetic field exceeds 0.3 T (tesla) at a low temperature region around a liquid nitrogen temperature and the magnetic field restricts performance of the superconducting wire, 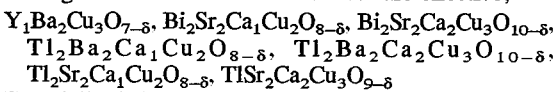 $Y_1Ba_2Cu_3O_{7-\delta}$, $Tl_2Ba_2Ca_1Cu_2O_{8-\delta}$, $Tl_2Ba_2Ca_2Cu_3O_{10-\delta}$, $Tl_2Sr_2Ca_1Cu_2O_{8-\delta}$, $TlSr_2Ca_2Cu_3O_{9-\delta}$, and their derivatives, or their mixtures are preferable for use.

Structure of the superconductors are selected depending on their object in use, and no special restriction exists in the present invention. A superconductor is obtained by filling the oxide superconductor powder or its precursor powder directly into an oxide dispersed silver pipe fabricated in accordance with the above described method and drawing the pipe. A most simple example of the conductor structure is the one which is obtained by arranging an oxide dispersed silver sheath at outer periphery surface of a superconductor core. A superconductor structure obtained by filling the superconductor powder or its precursor powder directly into a silver pipe, drawing the silver pipe to a wire, and further cladding the wire by inserting it into an oxide dispersed silver pipe, or by filling the superconductor powder or its precursor powder directly into a composite silver pipe which is previously manufactured by combining a silver layer and an oxide dispersed silver layer, drawing the composite silver pipe to a wire, gives a superconductor having a low electric resistance at the sheath portion and a preferable mechanical strength in order to maintain certain stability for quenching of the superconductor. The above example shows a single conductor structure, but the same structure can be selected easily for a multiconductor cable. Furthermore, in accordance with the present invention, a tape-shape conductor using silver or silver alloys having dispersed at least one of calcia, strontia, baria, and rare earth elements as for a base plate, and being formed a thick film on the base plate by a plasma spray method, a laser deposition method, a CVD method, a screen printing method, or a doctor blade method is effective. When a superconductor having a low thermal conductivity and a large electric resistance at the sheath portion for use as a current lead or a permanent switch and others is desired, increasing an amount of dispersed oxide and selecting an oxide dispersed silver layer structure for its sheath material are preferable. There is no special restriction in structure of the superconductor in practical use, but for instance, a case of multiconductor cable, a structure can be suggested as the one wherein an oxide superconductor according to the present invention is used as a conductor core, a single conductor cable is manufactured by filling the conductor core into a sheath which is made of silver or a silver alloy having at least one of dispersed oxide particles selected from a group of aluminum oxides, zirconium oxides, magnesium oxides, yttrium oxides, titanium oxides, and their composite oxides such as strontium titanate and drawing the sheath to a wire, and a plurality of the single conductor cables are bundled and inserted into the above sheath further, and drawn again to a wire. As for a superconducting cable used in power transmission, a conductor having the above described structure can be used. However, as for another embodiment, a coaxial cable structure can be exemplified. For example, the coaxial cable structure having a conductor portion of oxide superconductor at center of the cross section as a core, a sheath material portion of silver or a silver alloy having at least one of dispersed oxide particles selected from a group of aluminum oxides, zirconium oxides, magnesium oxides, yttrium oxides, titanium oxides, and their composite oxides such as strontium titanate at outer periphery of the conductor portion, an insulating material layer at outer periphery of the sheath material portion, an oxide superconductor portion at outer periphery of the insulating material layer, and again the sheath material portion at outer periphery of the oxide superconductor portion, all of which are arranged in a concentric manner, can be proposed.

The conductor manufactured in a desired structure as explained above is fabricated, further, in a form of leads, cables, or superconducting coils, and subsequently, a heat treatment for connecting the superconductor particles so as to realize electrically strong junction is performed. It is a so-called wind-and-react method. However, when deformation of the conductor is small, for example, such as utmost 0.5%, a so-called react-and-wind method wherein the superconductor particles are previously connected by the heat treatment, and then the conductor having electrically strong junction is fabricated in a form of leads, cables, or superconducting coils can be used. The above heat treatment is performed in order to enhance characteristics of the superconductor. Therefore, a condition for the heat treatment varies depending on materials, but generally, an atmosphere for the heat treatment is specified. For example, in a case of $Bi_2Sr_2Ca_1Cu_2O_{8-\delta}$ superconductor, a low oxygen partial pressure condition (for example 7% $O_2$) is selected for an atmosphere of a final heat treatment in order to obtain a preferable characteristics. However, in a case of $Tl_2Ba_2Ca_1Cu_2O_{8-\delta}$ superconductor, a high oxygen partial pressure condition is preferable as a final heat treatment condition, and, for example, a pure oxygen condition is selected. Even in the above described conditions, thermally stable oxides described previously are selected as reinforced materials for the sheath in the present invention, and further oxides which are chemically inactive with the oxide superconductor are selected. Therefore, the present invention has a feature that the reinforced materials for the sheath relating to the present invention are hardly effected by the atmosphere of the heat treatment.

In accordance with the present invention, a conductor having a preferable large mechanical strength can be provided by using an oxide superconducting wire wherein an oxide superconducting material is used as a core, silver or a silver alloy is coated above outer periphery of the core to form a structure, and a plurality of the structure are composed to form a composite oxide superconducting wire, characterized in that the silver or the silver alloy coating material includes dispersed oxides. Furthermore, one of features of the present invention is a capability of selecting a sheath material having both a relatively small thermal conductivity and a small electric conductivity or a sheath material having both a relatively large thermal conductivity and a large electric conductivity by controlling particle sizes, degree of dispersion, and an amount of the oxide particles added to the silver or the silver alloy coating material.

A superconducting magnet is sometimes composed in a form of multiple cylinders depending on its using object. Composing the form of multiple cylinders is an effective method when a generated magnetic field strength is large. For instance, it is effective in a case when outer cylindrical coils are composed of superconductors having a relatively small upper critical magnetic field, of which manufacturing method is relatively simple or low cost, and as for inner cylindrical coils, conductors having a high upper critical magnetic field, of which manufacturing method is even if expensive or complicated, must be selected. Especially, an all superconducting magnet such as the one exceeding 18 T is formed in a multiple cylindrical coils, and its inner coils can be realized by wire using $Bi_2Sr_2Ca_1Cu_2O_{8-\delta}$, or $Bi_2Sr_2Ca_2Cu_3O_{10-\delta}$ superconductor, but, at the present, wire using silver sheaths has only insufficient mechanical strength, and can not endure an electromagnetic force added to the inner cylindrical coils. As one of embodiments of the present invention, silver containing about 3% of dispersed materials such as calcia, strontia, baria, or oxides of rare earth elements having a small diameter less than 1000 Å for example is used as the sheath material, the sheath material is a preferably good conductor as functions as a stabilized material, and wire having a sufficient mechanical strength for enduring the electromagnetic force can be obtained. When an oxide superconductor is used as a current lead for a liquid helium cooled superconducting magnet apparatus, a sheath material having both a sufficient mechanical strength and a small thermal conductivity is desired. When a large amount of energy is stored by charging into a superconducting coil such as a superconducting magnet energy storage apparatus (SMES), the apparatus is essentially composed of mainly a superconducting coil and a permanent switch. In the above case, the coil and the switch are installed sometimes in separated cryostats, respectively, on account of necessity to flow a large current even to the permanent switch. According to an aim of the apparatus, less electric resistance loss at a cable connecting the superconducting coil and the switch is desired in order to decrease energy loss at storage. As for the cable, the superconductor relating to the present invention can effectively be used. In accordance with the present invention, silver containing materials such as calcia, strontia, baria, or oxides of rare earth elements more than 10% in a dispersed degree to give a sufficiently low thermal conductivity can be used as a sheath material.

DETAILED DESCRIPTION OF THE EMBODIMENTS

Hereinafter, the present invention is further explained in detail referring to the embodiments.

[Embodiment 1]

Figure 1:
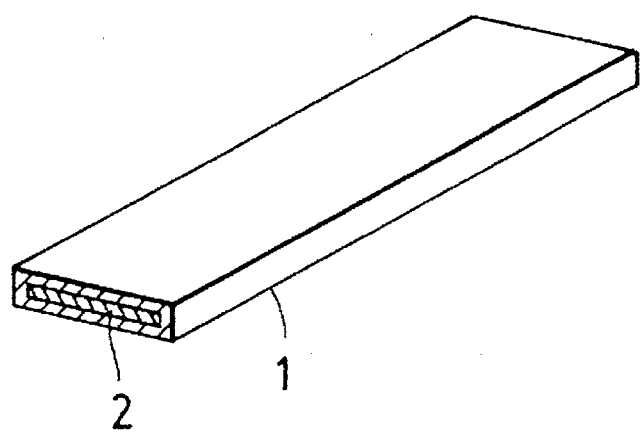
FIG. 1 is a partly sectional perspective view indicating a structure of an oxide superconducting wire relating to an embodiment of the present invention.

A raw material prepared by an oxalate coprecipitation method so as to be $Ba_{1.6}Sr_{0.4}Ca_{2.0}Cu_{3.0}O_\delta$ in a cation ratio is previously calcined in air at 650° C. for 15 hours, and subsequently the raw material is pulverized by a crusher for 30 minutes. At this time, a necessary amount of thallium oxide for making the cation ratio of the raw material to be $Tl_{2.0}Ba_{1.6}Sr_{0.4}Ca_{2.0}Cu_{3.0}O_\delta$ is previously added to the raw material. Powder of the raw material obtained as described above is calcined in an aluminum oxides crucible with a lid in air at 750° C. for 15 hours. Main component of the obtained powder was revealed as $Tl_2Ba_2Ca_1Cu_2O_{8-\delta}$ by powder X-ray diffraction analysis. According to an observation by a scanning electron microscope and an energy dispersive X-ray analysis, the powder included a material containing Sr—Ca—Cu—O of which crystal structure was unable to be determined, CaO, SrO and others. The above calcined material was again pulverized by a crusher for about 30 minutes so that its average diameter became a several micrometers, and obtained powder was used as the raw material for a superconducting wire. Next, the above raw material powder of the superconducting wire is filled in a pipe, 4.5 mm inner diameter and 6.0 mm outer diameter, one end of which is closed, made from silver wherein 10 by weight zirconium oxide having a diameter of 800 Å is dispersed by a mechanical alloying method. After the filling, an open end is closed, and the pipe is drawn to a wire by a drawing bench with a drafting ratio of about 20%. The worked pipe is annealed in air at 350°–400° C. after each drawing operation of two or three times drawings, and finally a wire of 0.7 mm in diameter is obtained. A test piece 4 cm long is cut out from the obtained wire, and is fabricated to a flatten shape by being pressed with a pressing machine of 20 t/cm². The flatten test piece is calcined in a crucible with a lid in air at 830° C. for 20 hours. The obtained test piece is pressed again with the pressing machine of 20 t/cm², and calcined again in a crucible with a lid in air at 830° C. for 20 hours. A structure of the obtained wire test piece is illustrated schematically in FIG. 1. The oxide superconductor core 2 has a tape shape structure cladded with a silver sheath 1 containing dispersed zirconium oxide therein. A critical temperature Tc and a critical current density Jc of the test piece obtained by repeating the above pressing and calcining four times were determined by a resistivity measurement using a standard four probe method at 77K under no outer magnetic field, and it was revealed that Tc and Jc were 115K and 30000 A/cm², respectively. A composition of the superconductor forming the core of the wire test piece prepared by the same method as described above was analyzed by an ICP method, and it was revealed that chemical composition of the test piece was $Tl_{1.68}Ba_{1.58}Sr_{0.41}Ca_{1.98}Cu_{3.0}O_\delta$.

[Embodiment 2]

A raw material powder of the wire prepared by the same method as that of the embodiment 1 was made into a wire using a silver pipe, 4.5 mm inner diameter and 6.0 mm outer diameter, including dispersed magnesium oxides particles having a crystal grain size of about 1100 Å by the same method as the embodiment 1. That is, after the above raw material powder is filled in the silver pipe, an open end of the pipe is closed, and the pipe is drawn to a wire by a drawing bench with a drafting ratio of about 20%. The worked pipe is annealed in air at 350°–400° C. after each drawing operation of two or three times drawings, and finally a wire of 0.7 mm in diameter is obtained. A test piece 4 cm long is cut out from the obtained wire, and is fabricated to a flatten shape by being pressed with a pressing machine of 20 t/cm². The flatten test piece is calcined in a crucible with a lid in air at 830° C. for 20 hours. The obtained test piece is pressed again with the pressing machine of 20 t/cm², and calcined again in a crucible with a lid in air at 830° C. for 20 hours. A critical temperature Tc and a critical current density Jc of the test piece obtained by repeating the above pressing and calcining four times were determined by a resistivity measurement using standard four probe method at 77K under no outer magnetic field, and it was revealed that Tc and Jc were 113K and 24000 A/cm², respectively. A composition of the superconductor forming the core of the wire test piece prepared by the same method as described above was analyzed by an ICP method, and it was revealed that chemical composition of the test piece was $Tl_{1.71}Ba_{1.62}Sr_{0.38}Ca_{1.96}Cu_{3.0}O_\delta$.

[Embodiment 3]

Figure 2:
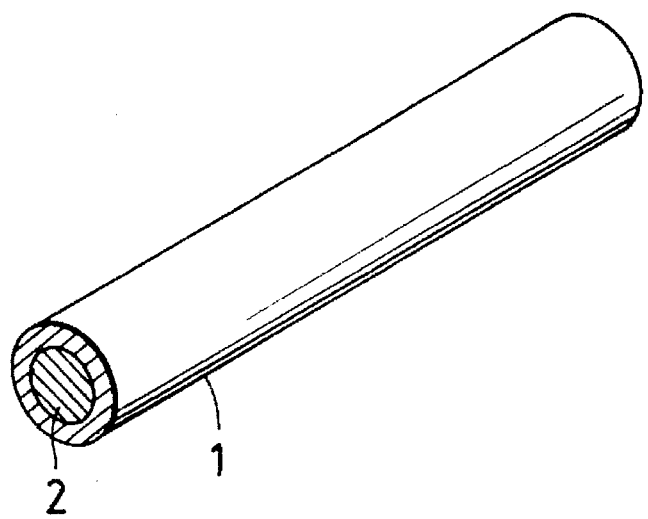
FIG. 2 is a partly sectional perspective view indicating a structure of an oxide superconducting wire relating to another embodiment of the present invention.

Necessary amounts of composing oxides such as SrO, CaO, and CuO for obtaining a cation ratio of $Bi_2Sr_2Ca_1Cu_2O_{8-\delta}$ are mixed and pulverized by a crusher for 30 minutes. The obtained mixed powder is calcined in an aluminum oxides crucible in air at 800° C. for 20 hours. The obtained powder was analyzed by an X-ray diffraction analysis, and it was revealed that a main component of the powder was $Bi_2Sr_2Ca_1Cu_2O_{8-\delta}$. According to an observation by a scanning electron microscope and an energy dispersive X-ray analysis, the powder included a material containing Sr—Ca—Cu—O of which crystal structure was unable to be determined, $Bi_2Sr_2Cu_1O_\delta$ and others. The above calcined material was pulverized by a crusher for about 30 minutes so that its average diameter became a several micrometers, and obtained powder was used as the raw material for a superconducting wire. Next, the above raw material powder of the superconducting wire is filled in a pipe, 4.5 mm inner diameter and 6.0 mm outer diameter, one end of which is closed, made from silver wherein 15% by weight aluminum oxides having a diameter of 2600 Å is dispersed by a mechanical alloying method. After the filling, an open end is closed, and the pipe is drawn to a wire by a drawing bench with a drafting ratio of about 20%. The worked pipe is annealed in air at 350°–400° C. after each drawing operation of two or three times drawings, and finally a wire of 0.7 mm in diameter is obtained. A test piece 4 cm long is cut out from the obtained wire, and is put into an aluminum oxides crucible. Temperature of the crucible is elevated to 800° C. in 3 hours under 1 atmosphere of pure oxygen environment, maintained for about 10 minutes at the temperature, lowered the temperature to 815° C. in 5 hours, and maintained at 815° C. for 20 hours. Next, the obtained wire is annealed for 25 hours under a 7% oxygen atmosphere. Structure of the obtained wire test piece is illustrated schematically in FIG. 2. The oxide superconductor $Bi_2Sr_2Ca_1Cu_2O_{8-\delta}$ 2 forms a core, and wire having a circular cross sectional structure is formed with a cladding made of a silver sheath 1 containing dispersed aluminum oxides therein. A critical temperature Tc and a critical current at 4.2K of the obtained test piece were determined by a resistivity measurement using standard four probe method. It was revealed that Tc and the critical current were 84K and 115 A, respectively. A composition of the superconductor forming the core of the wire test piece prepared by the same method as described above was analyzed by an ICP method, and it was revealed that chemical composition of the test piece was $Bi_{1.98}Sr_{2.01}Ca_{0.98}Cu_2O_{8-\delta}$.

[Embodiment 4]

Figure 3:
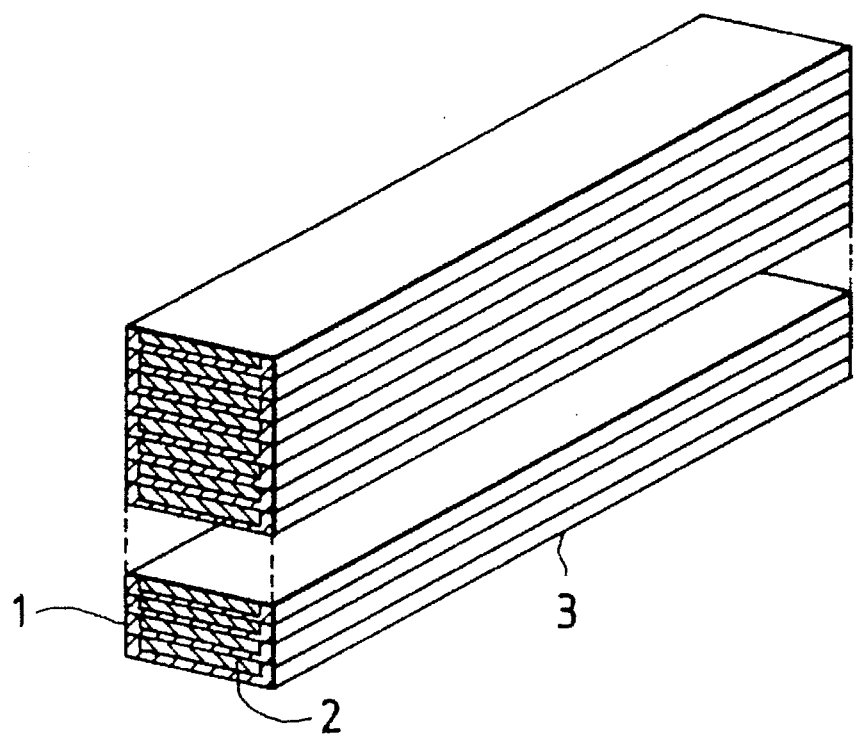
FIG. 3 is a partly sectional perspective view indicating a laminated structure of oxide superconducting wire relating to an embodiment of the present invention.

A raw material prepared by an oxalate coprecipitation method so as to be $Ba_{1.6}Sr_{0.4}Ca_{2.0}Cu_{3.0}O_\delta$ in a cation ratio is previously calcined in air at 650° C. for 15 hours, and subsequently the raw material is pulverized by a crusher for 30 minutes. At this time, a necessary amount of thallium oxide for making the cation ratio of the raw material to be $Tl_{2.0}Ba_{1.6}Sr_{0.4}Ca_{2.0}Cu_{3.0}O_\delta$ is previously added to the raw material. Powder of the raw material obtained as described above is calcined in an aluminum oxides crucible with a lid in air at 750° C. for 15 hours. Main component of the obtained powder was revealed as $Tl_2Ba_2Ca_1Cu_2O_{8-\delta}$ by powder X-ray diffraction analysis. According to an observation by a scanning electron microscope, the powder included a material containing Sr—Ca—Cu—O of which crystal structure was unable to be determined, CaO, SrO and others. The above calcined material was again pulverized by a crusher for about 30 minutes so that its average diameter became a several micrometers, and obtained powder was used as the raw material for a superconducting wire. Next, the above raw material powder of the superconducting wire is filled in a pipe, 6.0 mm inner diameter and 8.0 mm outer diameter, one end of which is closed, made from silver wherein 20% by weight zirconium oxide having a diameter of 3800 Å is dispersed by a mechanical alloying method. After the filling, an open end is closed, and the pipe is drawn to a wire by a drawing bench with a drafting ratio of about 20%. The worked pipe is annealed in air at 350°–400° C. after each drawing operation of two or three times drawings, and finally a wire of 1.2 mm in diameter is obtained. The obtained wire is further manufactured to a tape shape of about 0.7 mm thick and about 6 mm wide by a rolling mill having rollers of 100 mm in diameter, and 20 test pieces of 110 mm long are cut out from the tape shaped wire. Each of the 20 test pieces is pressed by a pressing machine of 20 t/cm² to form a flatten shape of about 0.25 mm thick. Subsequently, the obtained 20 flatten shape test pieces are stacked and press-welded with a pressure of about 2 t/cm² to form a rectangular cross section. The obtained conductor having a rectangular cross section of about 9 mm wide and about 4.7 mm thick is annealed in air at 830° C. for 30 hours. The obtained conductor is pressed again with a pressure of about 2 t/cm² and annealed in pure oxygen at 830° C. for 30 hours. A cross sectional structure of the obtained conductor is illustrated schematically in FIG. 3. The conductor is composed with 20 elementary wires 3 in each of which the oxide superconductor $Tl_{2.0}Ba_{1.6}Sr_{0.4}Ca_{2.0}Cu_{3.0}O_\delta$ 2 is used as a core which is coated with a silver sheath 1 containing dispersed zirconium oxide therein. Current leads made of copper mesh are respectively connected to each of both ends of the obtained conductor, and voltage terminals made of silver wire were attached at middle portion of the conductor with intervals of respective 30 mm. The obtained conductor was fixed to a holder made of fiber reinforced plastic and installed in a cryostat, and a critical current was measured with cooled with liquid nitrogen. The critical current was 630 A.

[Embodiment 5]

Necessary amounts of composing oxides such as SrO, CaO, and CuO for obtaining a cation ratio of $Bi_2Sr_2Ca_2Cu_3O_{10-\delta}$ are mixed and pulverized by a crusher for 30 minutes. The obtained mixed powder is calcined in an aluminum oxides crucible in air at 790° C. for 20 hours. The obtained powder was analyzed by an X-ray diffraction analysis, and it was revealed that a main component of the powder was $Bi_2Sr_2Ca_1Cu_2O_{8-\delta}$. According to an observation by a scanning electron microscope and an energy dispersive X-ray analysis, the powder included a material containing Sr—Ca—Cu—O of which crystal structure was unable to be determined, SrO and others. The above calcined material was pulverized by a crusher for about 30 minutes so that its average diameter became a several micrometers, and obtained powder was used as the raw material for superconducting wire. The above raw material powder of the superconducting wire is filled in a pipe, 4.5 mm inner diameter and 6.0 mm outer diameter, one end of which is closed, made from silver wherein 35% by weight zirconium oxides having a diameter of 2600 Å is dispersed by a mechanical alloying method. After the filling, an open end is closed, and the pipe is drawn to a wire by a drawing bench with a drafting ratio of about 20%. The worked pipe is annealed in air at 350°–400° C. after each drawing operation of two or three times drawings, and finally a wire of 1.2 mm in diameter is obtained. The obtained wire is further manufactured to a tape shape of about 0.7 mm thick and about 6 mm wide by a rolling mill having a roll of 100 mm in diameter, and 20 test pieces of 110 mm long are cut out from the tape shaped wire. Each of the 20 test pieces is pressed by a pressing machine of 20 t/cm² to form a flatten shape of about 0.25 mm thick. Subsequently, the obtained 20 flatten shape test pieces are stacked and press-welded with a pressure of about 2 t/cm² to form a rectangular cross section. The obtained conductor having a rectangular cross section of about 9.1 mm wide and about 4.5 mm thick is annealed in air at 800° C. for 15 hours. The obtained conductor is pressed again with a pressure of about 2 t/cm², and annealed in air at 830° C. for 40 hours. The obtained conductor is pressed again with a pressure of about 2 t/cm², and annealed in air at 845° C. for 40 hours. Current leads made of copper mesh are respectively connected to each of both ends of the obtained conductor, and voltage terminals made of silver wire were attached at middle portion of the conductor with intervals of respective 30 mm. The obtained conductor was fixed to a holder made of fiber reinforced plastic and installed in a cryostat, and a critical current was measured with cooled with liquid nitrogen. The critical current was 720 A.

[Embodiment 6]

Figure 4:
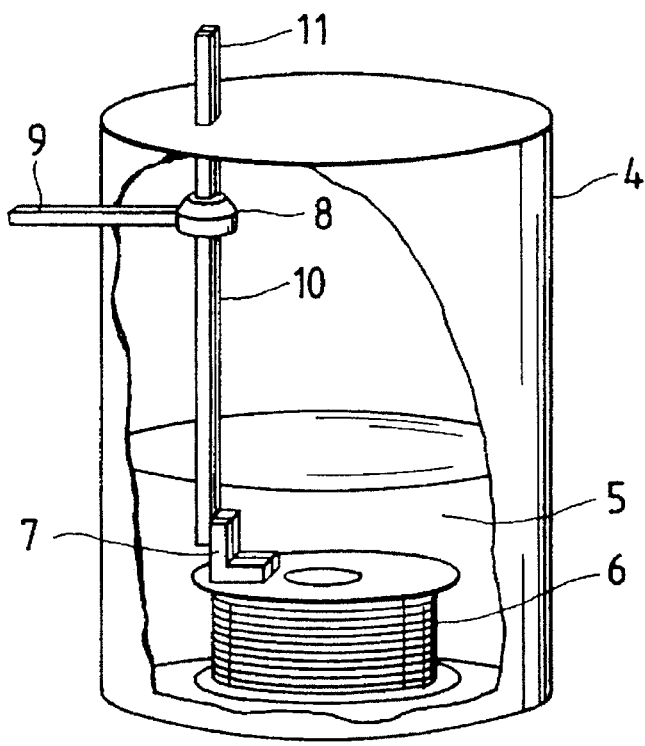
FIG. 4 is a partly sectional perspective view of a cryostat using an oxide superconducting relating to an embodiment of the present invention.

The conductor obtained in the embodiment 4 was connected to a superconducting coil 6 of 1T using a NbTi superconducting wire shown in FIG. 4 in a cryostat 4 at a portion for connecting outer power source as for an oxide superconducting current lead 10 via a lead connecting terminal 7. The connecting portion of the oxide current lead and the coil is immersed in liquid helium 5, upper portion of the lead is connected with copper lead 11 at a thermal anchor 8 having an inlet for liquid nitrogen 9, and the connecting portion of the oxide current lead 10 and the copper lead 11 is cooled by liquid nitrogen. The copper current lead portion has a structure which is cooled by helium gas generated in the cryostat and exhausted outside through a helium gas guide pipe. Penetrating heat calibrated to that of 200 A current flows which is estimated from a generated amount of helium gas at power off was about 0.4 W/kA, and penetrating heat at actually 200 A current flows was as small as about 0.55 W/kA. It could be explained that because the oxide superconducting current lead in the cryostat operated in a superconducting condition, and resistance heat generation hardly occurred.

[Embodiment 7]

Figure 5A:
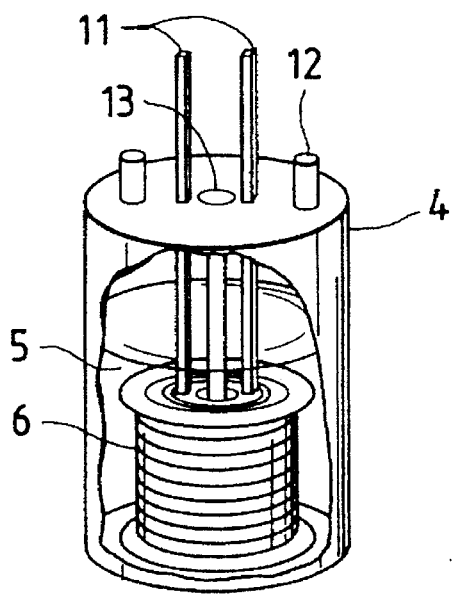
FIG. 5a is a partly sectional perspective view of another cryostat using an oxide superconducting wire relating to an embodiment of the present invention.

FIG. 5a illustrates an embodiment of multistructural type super strong magnetic field magnet. A superconducting coil 6 is installed in a cryostat 4 cooled with liquid helium 5, and a test port 13 is provided inside of an inner coil 16. A coolant inlet 12 is provided at upper portion of the cryostat, and coolant is supplied through the inlet. The superconducting coil is excited by being supplied with power from outside through a current lead 11.

Figure 5B:
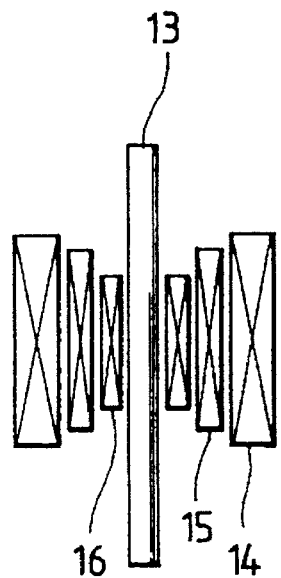
FIG. 5b is a schematic illustration indicating a composition of a coil using an oxide superconducting wire relating to an embodiment of the present invention.

FIG. 5b is a schematic illustration indicating a composition of a coil using an oxide superconducting wire relating to the present invention. The superconducting coil is composed with three layers, that is, an outer layer coil 14 is a coil using NbTi alloy type superconductor, a middle layer coil is a coil using (Nb/Ti)$_3$Sn compound type superconductor, and an inner layer coil is a coil using a circular cross sectional superconductor prepared by the same method as that of the embodiment 3 having Bi$_2$Sr$_2$Ca$_1$Cu$_2$O$_{8-\delta}$ superconductor as a core and a silver sheath containing dispersed aluminum oxides therein as a coating. In this case, a critical current density of the Bi$_2$Sr$_2$Ca$_1$Cu$_2$O$_{8-\delta}$ superconductor at a liquid helium temperature in a magnetic field exceeding 18 T is larger than that of conventional NbTi alloy type superconductor and (Nb/Ti)$_3$Sn compound type superconductor, and accordingly a larger magnetic field than magnetic fields generated by the above other superconductors can be generated.

In accordance with the present invention, a conductor having preferable mechanical strength, and preferably controlled electric conductivity and thermal conductivity to arbitrary ranges corresponding to its use object can be composed. Especially, an advantage in improving mechanical strength of the conductors is remarkable, and chemically stable materials can be obtained in accordance with the present invention.

What is claimed is:

1. Oxide superconducting wire comprising
   a conductor core composed of oxide superconducting material, an elementary wire having a metallic sheath material composed of silver or a silver alloy formed at periphery of said conductor core, and
   said metallic sheath material formed at periphery of a plurality of said elementary wire, characterized in that
   said metallic sheath material is a composite containing dispersed oxide particles therein.

2. Oxide superconducting wire as claimed in claim 1, wherein
   said metallic sheath material is a composite containing dispersed particles of at least one of metallic oxides selected from a group of aluminum oxides, zirconium oxides, magnesium oxides, yttrium oxides, titanium oxides, and complex oxides of the above elements therein.

3. Oxide superconducting wire as claimed in claim 2, wherein
   a tensile strength of said oxide superconducting wire is at least 10 kgf/mm².

4. A composite superconducting coil comprising
   a plurality of block coils which are composed separately in a coaxial cylinder shape, wherein
   at least one of said coils is a conductor core composed of oxide superconducting material,
   periphery of said conductor core is cladded with a sheath material composed of silver or a silver alloy, which contains dispersed particles of at least one of oxides selected from a group of aluminum oxides, zirconium oxides, magnesium oxides, yttrium oxides, titanium oxides, and complex oxides of the above elements therein.

5. A composite superconducting coil comprising
   a plurality of block coils which are composed separately in a coaxial cylinder shape, wherein
   at least one of said block coils is a conductor core composed of oxide superconducting material,
   periphery of said conductor core is cladded with a composite sheath material composed of at least two kinds of sheath materials, and
   at least one of said sheath materials is dispersed particles of at least one of oxides selected from a group of aluminum oxides, zirconium oxides, magnesium oxides, yttrium oxides, titanium oxides, and complex oxides of the above elements.

6. A composite superconducting coil as claimed in claim 5, wherein
   other block coils than said conductor coil are a metallic group or an intermetallic compound group superconductor.

7. A superconducting apparatus comprising
   a superconducting coil composed of an oxide superconducting material,
   a cryostat for cooling said superconducting coil,
   a current lead for supplying power to said superconducting coil from outside, and
   a thermal anchor for maintaining a specified portion of said current lead at a specified temperature, characterized in forming a conductor core composed of said oxide superconducting material at a portion lower than said specified portion of said current lead maintained at said specified temperature in said cryostat, forming a conductor composed of a composite sheath materials comprising of silver or silver alloys at periphery of said conductor core, and dispersing oxides in said composite sheath material.

8. A superconducting apparatus as claimed in claim 7, wherein said composite sheath material is a composite containing dispersed particles of at least one of oxides selected from a group of aluminum oxides, zirconium oxides, magnesium oxides, yttrium oxides, titanium oxides, and complex oxides of the above elements therein.

9. An energy storage system comprising:

an energy storing apparatus including a superconducting coil, an energy input/output apparatus for supplying or reproducing electric energy to/from said energy storing apparatus, and an oxide superconducting current lead connecting said energy storing apparatus to said energy input/output apparatus, wherein said oxide superconducting current lead comprises a conductor core formed with a superconductor having a critical temperature higher than a critical temperature of a superconductor used in said superconducting coil, and a sheath material, comprising silver or silver alloys and dispersed oxides therein, at periphery of said conductor core.

10. An energy storage apparatus as claimed in claim 9, wherein said sheath material is a composite containing dispersed particles of at least one of oxides selected from a group of aluminum oxides, zirconium oxides, magnesium oxides, yttrium oxides, titanium oxides, and complex oxides of the above elements therein.

11. An energy storage apparatus as claimed in claim 9, further comprising a lead connecting terminal electrically connecting said energy storing apparatus to said oxide superconducting current lead.

* * * * *